US012538625B2

(12) United States Patent
Hsieh et al.

(10) Patent No.: US 12,538,625 B2
(45) Date of Patent: Jan. 27, 2026

(54) SEMICONDUCTOR DEVICE AND DISPLAY DEVICE

(71) Applicant: AU OPTRONICS CORPORATION, Hsin-Chu (TW)

(72) Inventors: Chia-Ting Hsieh, Hsin-Chu (TW); Chien-Fu Huang, Hsin-Chu (TW); Cheng-Nan Yeh, Hsin-Chu (TW); Seok-Lyul Lee, Hsin-Chu (TW); Yung-Hsiang Lan, Hsin-Chu (TW); June-Woo Lee, Hsin-Chu (TW); Sung-Yu Su, Hsin-Chu (TW); Hsien-Chun Wang, Hsin-Chu (TW); Ya-Jung Wang, Hsin-Chu (TW); Hsin-Ying Lin, Hsin-Chu (TW); Yu-Chieh Lin, Hsin-Chu (TW); Yang-En Wu, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 461 days.

(21) Appl. No.: 17/721,640

(22) Filed: Apr. 15, 2022

(65) Prior Publication Data

US 2022/0336523 A1 Oct. 20, 2022

Related U.S. Application Data

(60) Provisional application No. 63/177,345, filed on Apr. 20, 2021.

(30) Foreign Application Priority Data

Mar. 16, 2022 (TW) .................................. 111109651

(51) Int. Cl.
H10H 29/14 (2025.01)
G09G 3/32 (2016.01)

(52) U.S. Cl.
CPC ............... *H10H 29/14* (2025.01); *G09G 3/32* (2013.01); *G09G 2300/0426* (2013.01); *G09G 2300/0804* (2013.01); *G09G 2330/021* (2013.01)

(58) Field of Classification Search
CPC .......... G09F 9/33; G09G 3/32; H10H 20/816; H10H 20/8162; H10H 20/857; H10H 29/14; H10H 29/142
(Continued)

(56) References Cited

U.S. PATENT DOCUMENTS

2006/0118869 A1* 6/2006 Lan ..................... H10D 30/6746
257/E29.151
2006/0119548 A1* 6/2006 Lan ...................... G09G 3/3233
345/76
(Continued)

FOREIGN PATENT DOCUMENTS

CN 102983147 A 3/2013
CN 104183208 A 12/2014
(Continued)

*Primary Examiner* — Fazli Erdem
(74) *Attorney, Agent, or Firm* — WPAT, PC

(57) ABSTRACT

The present disclosure provides a semiconductor device, including a buffer layer, a first sub-chip and a second sub-chip, and a connecting element. The first sub-chip and the second sub-chip are separately arranged on the buffer layer. Each of the first sub-chip and the second sub-chip includes a first diffusion layer, an active layer, and a second diffusion layer. The first diffusion layer, the active layer, and the second diffusion layer are sequentially arranged on the buffer layer in a top-down approach. The first diffusion layer and the buffer layer are first-type epitaxial layers, and the second diffusion layer is a second-type epitaxial layer. The connecting element is configured to couple the second diffusion layer of the first sub-chip and the first diffusion layer of the second sub-chip.

10 Claims, 6 Drawing Sheets

(58) Field of Classification Search
USPC .......................................................... 257/211
See application file for complete search history.

(56) References Cited

U.S. PATENT DOCUMENTS

| | | | | |
|---|---|---|---|---|
| 2012/0080691 | A1* | 4/2012 | Hung | H01L 27/156 |
| | | | | 257/E33.012 |
| 2014/0313242 | A1* | 10/2014 | Kaplan | G09G 3/3208 |
| | | | | 345/694 |
| 2014/0354698 | A1 | 12/2014 | Lee et al. | |
| 2017/0154601 | A1* | 6/2017 | Gao | G09G 3/20 |
| 2019/0088179 | A1* | 3/2019 | Song | G09G 3/3258 |
| 2021/0336078 | A1* | 10/2021 | Fan | H10D 30/0295 |

FOREIGN PATENT DOCUMENTS

| | | |
|---|---|---|
| CN | 104241508 A | 12/2014 |
| CN | 107611154 A | 1/2018 |
| KR | 20130061155 A | 6/2013 |

* cited by examiner

SEMICONDUCTOR DEVICE AND DISPLAY DEVICE

CROSS-REFERENCE TO RELATED APPLICATION

This application claims priority to U.S. Provisional Application Ser. No. 63/177,345, filed Apr. 20, 2021, and Taiwan Application Serial Number 111109651, filed Mar. 16, 2022, which are herein incorporated by reference in their entirety.

BACKGROUND

Field of Invention

The present disclosure relates to a semiconductor device and a display device. More particularly, the present disclosure relates to a semiconductor device and a display device that include series-connected light emitting diodes (LEDs).

Description of Related Art

To manufacture micro light emitting diode (micro LED) displays, LED structures are miniaturized to the size about 1~10 μm, then micro LEDs are transferred in bulk onto the circuit board, and physical deposition process is used for the packaging. Micro LED displays have high brightness and are suitable for outdoor use, but most of them are battery-powered. Accordingly, to enhance the use time of micro LED displays, their power consumption should be reduced.

SUMMARY

The present disclosure provides a semiconductor device, including a buffer layer, a first sub-chip and a second sub-chip, and a connecting element. The first sub-chip and the second sub-chip are separately arranged on the buffer layer. Each of the first sub-chip and the second sub-chip includes a first diffusion layer, an active layer, and a second diffusion layer. The first diffusion layer, the active layer, and the second diffusion layer are arranged on the buffer layer in a top-down order, the first diffusion layer and the buffer layer are first-type epitaxy layers, and the second diffusion layer is a second-type epitaxy layer. The connecting element is configured to electrically couple the second diffusion layer of the first sub-chip with the first diffusion layer of the second sub-chip.

The present disclosure also provides a display device, including a plurality of pixels, a first reference voltage terminal, a second reference voltage terminal, and a third reference voltage terminal. Each of the pixels includes a plurality of sub-pixel groups. A first sub-pixel group of the plurality of sub-pixel groups includes at least two first light-emitting components coupled in series. The first reference voltage terminal is configured to provide a first reference voltage to the pixels. The second reference voltage terminal is configured to provide a second reference voltage to the pixels. The third reference voltage terminal is configured to provide a third reference voltage to the pixels. The first reference voltage, the second reference voltage, and the third reference voltage are different from each other. The first light-emitting components coupled in series in the first sub-pixel group are coupled between the first reference voltage terminal and the second reference voltage terminal, and a second sub-pixel group of the plurality of sub-pixel groups is coupled to the third reference voltage terminal.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
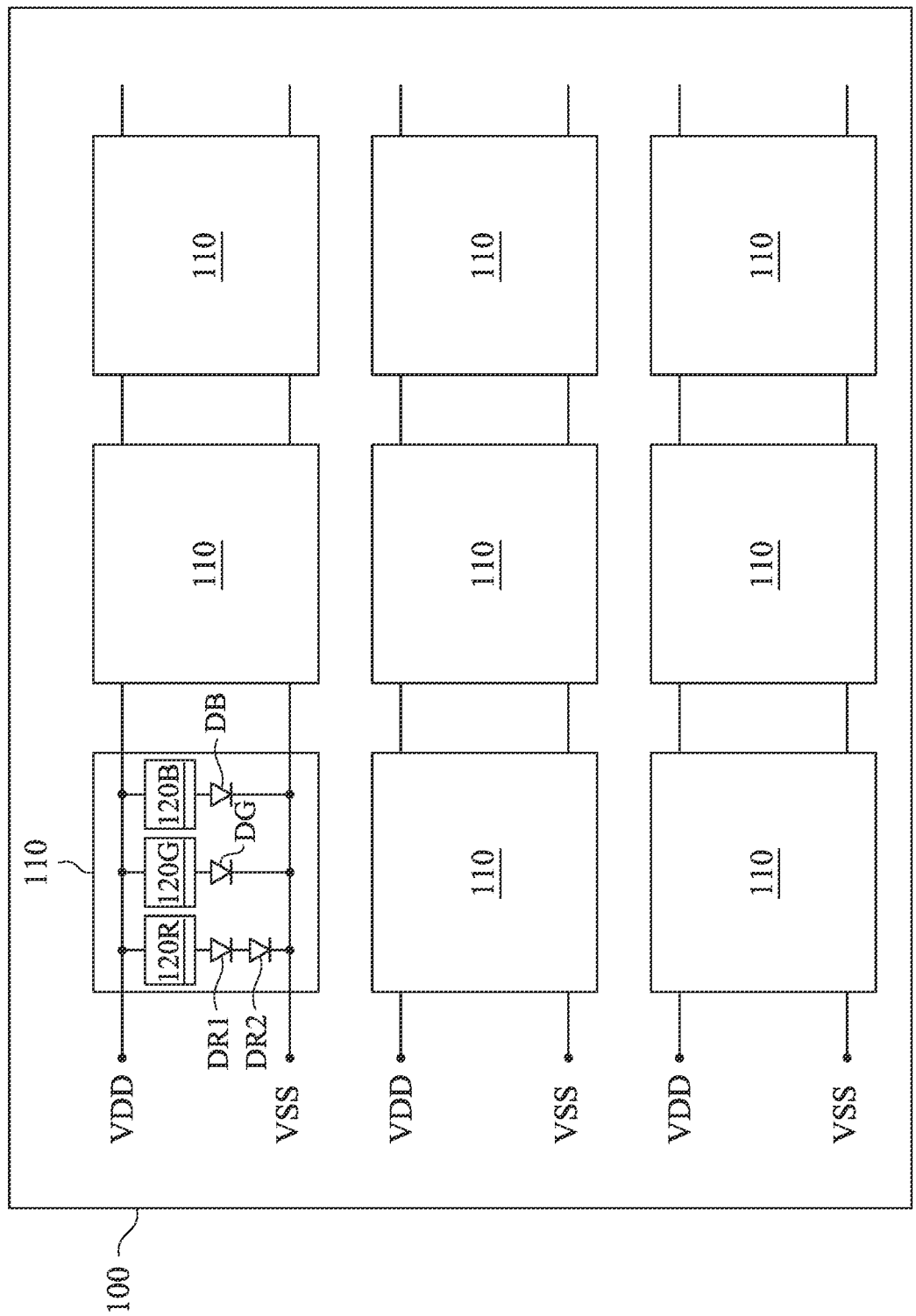
FIG. 1 is a diagram of part of a display device in accordance with some embodiments of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification generally have their ordinary meanings in the art, within the context of the invention, and in the specific context where each term is used.

As used in the present disclosure, the terms "comprising," "including," "having," "containing," "involving," and the like are to be understood to be open-ended, i.e., to mean including but not limiting to. In addition, as used in the present disclosure, the term "and/or" includes any and all combinations of one or more of the associated listed items. Moreover, it will be understood that, although the terms "first," "second," etc., may be used herein to describe various elements, these elements should not be limited by these terms. These terms are used to distinguish one element from another.

One embodiment of the present disclosure relates to a display device. Please refer to FIG. 1. FIG. 1 is a diagram of part of a display device 100 in accordance with some embodiments of the present disclosure. The display device 100 includes multiple pixels 110. The pixels 110 are arranged in an array in the display device 100. In other words, the pixels 110 are arranged in multiple columns and rows. In addition, in the embodiment of FIG. 1, the pixels 110 arranged in the same row are coupled to the voltages VDD and VSS through the same electric wires. The voltage VDD has a relatively high voltage level, and the voltage VSS has a relatively low voltage level. This embodiment is merely exemplary, and different wire design can be used in different embodiments (such as the embodiments shown in FIGS. 5A-6B described below) to provide voltage to the pixels 110. The size and number of the pixels 110 in the embodiment in FIG. 1 are exemplary as well and do not represent the actual size and number of the pixels 110.

Like the pixel 110 in the top left corner in FIG. 1, each pixel 110 shown in FIG. 1 includes driving circuits 120R, 120G, and 120B and light emitting diodes (LEDs) DR1, DR2, DG, and DB. The driving circuits 120R, 120G, and 120B are configured to receive voltage VDD to drive corresponding LED(s) to emit light. Specifically, the first ends of the driving circuits 120R, 120G, and 120B are configured to receive the voltage VDD, the second end of the driving circuit 120R is coupled to the LEDs DR1 and DR2, the second end of the driving circuit 120G is coupled to the LED DG, and the second end of the driving circuit 120B is coupled to the LED DB. The second ends of the LEDs DR2, DG, and DB are configured to receive the voltage VSS.

As shown in FIG. 1, the LEDs DR1 and DR2 coupled to the driving circuit 120R can be regarded as a first sub-pixel group, the LED DG coupled to the driving circuit 120G can be regarded as a second sub-pixel group, and the LED DB coupled to the driving circuit 120B can be regarded as a third sub-pixel group. In other words, each pixel 110 includes three sub-pixel groups, and each sub-pixel group is driven by the corresponding driving circuit to emit light. In some embodiments, the first sub-pixel group includes red LED(s) and is configured to emit red light, the second sub-pixel group includes green LED(s) and is configured to emit green light, and the third sub-pixel group includes blue LED(s) and is configured to emit blue light.

In some embodiments, the display device 100 includes a gate driving circuit and a source driving circuit (not shown in FIG. 1). The gate driving circuit is configured to activate and turn on the driving circuits 120R, 120G, and 120B, and the source driving circuit is configured to provide the voltage VDD to the driving circuits 120R, 120G, and 120B. Accordingly, the display device 100 can determine the timing that each pixel 110 emits light through the gate driving circuit and determine the brightness of each pixel 110 through the source driving circuit.

It is worth noted that one of the sub-pixel groups in the pixel 110 includes two series-connected LEDs. In the embodiment shown in FIG. 1, the first sub-pixel group includes the LED DR1 and DR2 that are coupled in series. However, the present disclosure is not limited to this embodiment. In alternative embodiments, there can be multiple sub-pixel groups that have series-connected LEDs, and the series-connected LEDs in those sub-pixel groups can be more than two. The series connection of LEDs in sub-pixel group(s) can reduce the power consumption of the display device 100. Below discuss relevant details through FIGS. 2A and 2B.

Figure 2B:
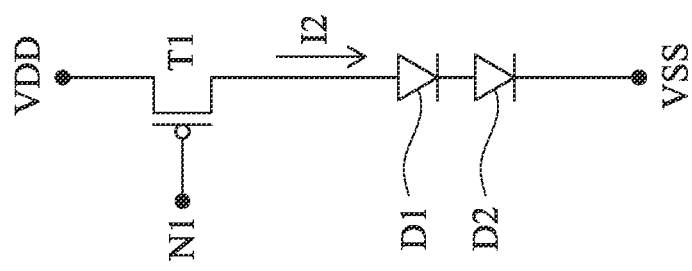
FIG. 2B is a diagram of a sub-pixel display circuit in accordance with some embodiments of the present disclosure.
Figure 2A:
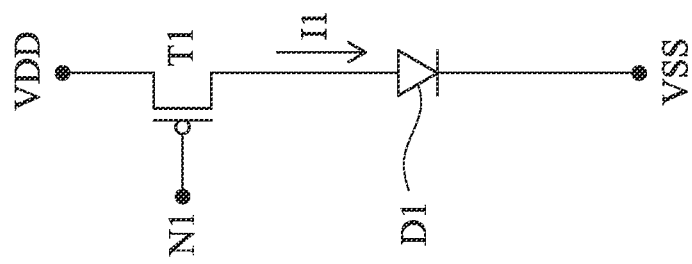
FIG. 2A is a diagram of a sub-pixel display circuit in accordance with some embodiments of the present disclosure.

FIGS. 2A and 2B are diagrams of a sub-pixel display circuit in accordance with some embodiments of the present disclosure. The display circuit in FIG. 2A does not adopt the series-connected LEDs; instead, it includes only one LED D1. The display circuit in FIG. 2B adopts the series-connected LEDs and includes the LEDs D1 and D2 connected in series. In these two embodiments, a transistor T1 is used to drive a sub-pixel group, and the transistor T1 and the sub-pixel are both coupled between the voltage VDD and the voltage VSS.

In the display circuit in FIG. 2A, the first end of the transistor T1 receives the voltage VDD, the second end of the transistor T1 is coupled to the LED D1, the second end of the LED D1 is coupled to the voltage VSS, and a current I1 passes through the transistor T1 and the LED D1. In the display circuit in FIG. 2B, assuming that the LEDs D1 and D2 are the same kind of LED and have the same resistance and forward voltage, the resistance of the sub-pixel in FIG. 2B (i.e., LEDs D1 and D2) is about two times as the resistance of the sub-pixel in FIG. 2A (i.e., LED D1) (resistance of the transistor T1 is ignored here). Therefore, the current I2 that passes through the transistor T1, the LED D1, and the LED D2 has a size of about half of the current I1.

With respect to the power consumption of the sub-pixel (i.e., the LED(s)), though the current I2 is about half of the current I1, the voltage difference between the two ends of the series-connected LEDs D1 and D2 in FIG. 2B is two times as the voltage difference between the two ends of the LED D1 in FIG. 2A. Therefore, the power consumption of the LED(s) in these two display circuits are the same (power consumption=current×voltage). However, with respect to the power consumption of the transistor T1, because the current I2 is about half of the current I1, the power consumption of the transistor T1 in FIG. 2B is smaller than the power consumption of the transistor T1 in FIG. 2A. In addition, both of the display circuits in FIGS. 2A and 2B need additional circuits (not shown in FIGS. 2A and 2B) to provide voltage to the node N1. The voltage at node N1 will determine the current both in the two circuits. Because the current I2 is about half of the current I1, the circuit configured to provide voltage to the node N1 in FIG. 2B will consume less power than such circuit in FIG. 2A as well.

Based on the above comparison between the display circuits in FIGS. 2A and 2B, using LEDs coupled in series can help to reduce power consumption of circuit. Therefore, the embodiments of the present disclosure (such as the display circuit 100 shown in FIG. 1) have at least one sub-pixel group including LEDs connected in series in each pixel, in order to enhance power efficiency of display circuits.

Figure 3:
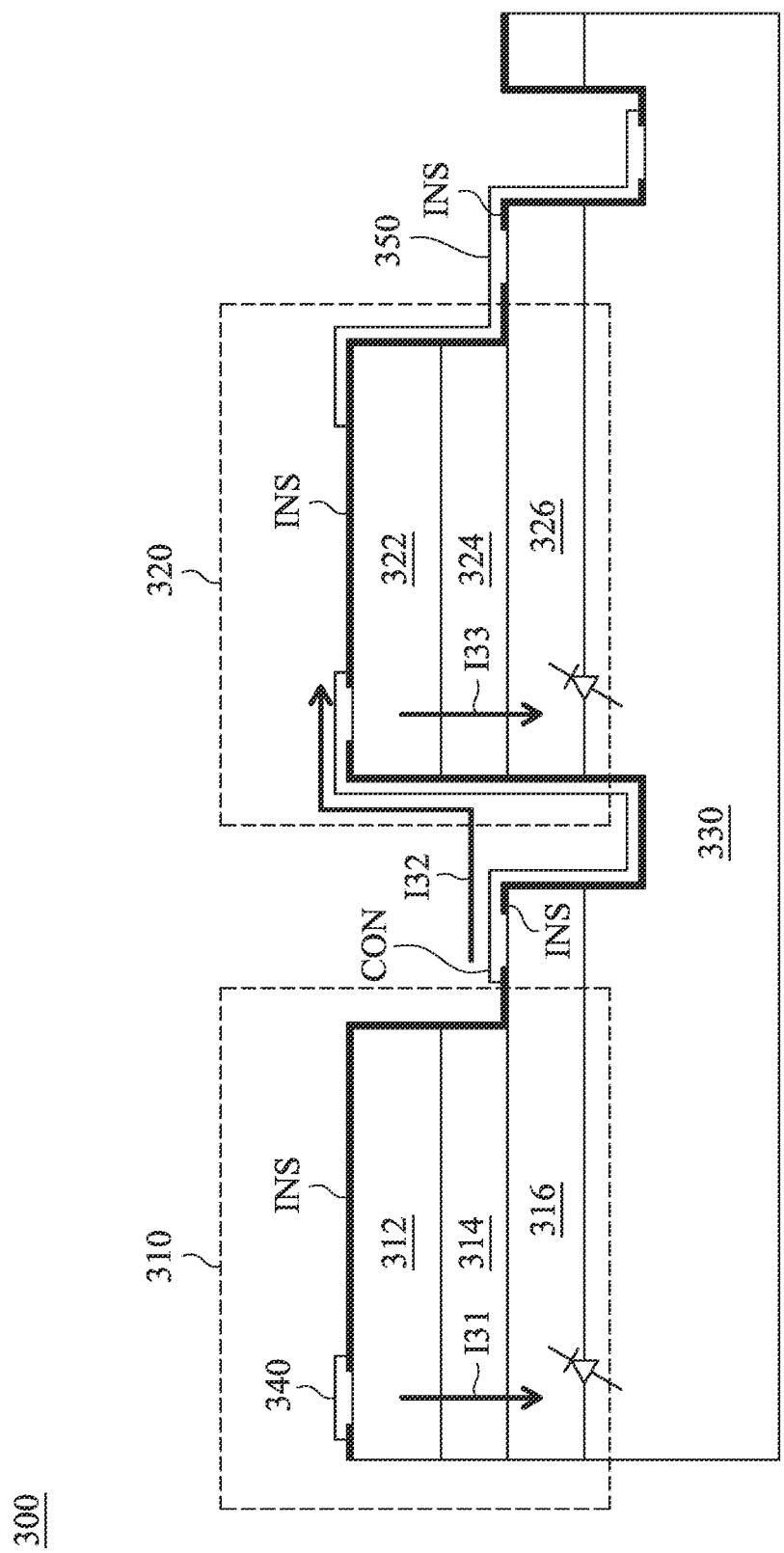
FIG. 3 is a cross-section diagram of a semiconductor device in accordance with some embodiments of the present disclosure.

Another embodiment of the present disclosure relates to a semiconductor structure on which multiple series-connected LEDs are manufactured. Please refer to FIG. 3. FIG. 3 is a cross-section diagram of a semiconductor device 300 in accordance with some embodiments of the present disclosure. The semiconductor device 300 includes a buffer layer 330 and two sub-chips 310 and 320 that are formed on the buffer layer 330. In some embodiments, the two sub-chips 310 and 320 correspond to the series-connected LEDs DR1 and DR2 in FIG. 1. The sub-chips 310 and 320 are separately and independently arranged on the buffer layer 330. The sub-chip 310 includes a first diffusion layer 312, an active layer 314, and a second diffusion layer 316, and the first diffusion layer 312, the active layer 314, and the second diffusion layer 316 are arranged on the buffer layer 330 in a top-down order, as shown in FIG. 3. The sub-chip 320 includes a first diffusion layer 322, an active layer 324, and a second diffusion layer 326, and the first diffusion layer 322, the active layer 324, and the second diffusion layer 326 are arranged on the buffer layer 330 in a top-down order, as shown in FIG. 3.

In some embodiments, the first diffusion layer 312 of the sub-chip 310, the first diffusion layer 322 of the sub-chip 320, and the buffer layer 330 are one type of epitaxy layer, and the second diffusion layer 316 of the sub-chip 310 and the second diffusion layer 326 of the sub-chip 320 are the other type of epitaxy layer. For example, in the embodiment shown in FIG. 3, the first diffusion layer 312, the first diffusion layer 322, and the buffer layer 330 are p-type epitaxy layers that include p-type dopant(s), and the second diffusion layer 316 and the second diffusion layer 326 are n-type epitaxy layers that include n-type dopant(s).

In some embodiments, the active layer 314 of the sub-chip 310 and the active layer 324 of the sub-chip 320 include quantum well (MQW) structure(s) that is configured to emit light when a current passes through.

In the embodiment shown in FIG. 3, the semiconductor device 300 can further include an electrode 340, an electrode 350, and a connecting element CON. The electrode 340, the electrode 350, and the connecting element CON are conductors (e.g., metal) and are configured to transmit current. The electrode 340 is arranged on the first diffusion layer 312 of the first sub-chip 310 and is configured to receive a relatively high voltage to be used as an anode of the semiconductor device 300. The connecting element CON is configured to electrically couple the second diffusion layer 316 of the first sub-chip 310 with the first diffusion layer 322 of the second sub-chip 320. The electrode 350 is configured to electrically couple the second diffusion layer 326 of the second sub-chip 320 with the buffer layer 330, and the electrode 350 is configured to receive a relatively low voltage to be used as a cathode of the semiconductor device 300. In one embodiment, insulation layers are arranged at several places of the semiconductor device 300 to ensure that the electrode 340, the electrode 350, and the connecting element CON are correctly coupled to the corresponding structure(s) of the semiconductor device 300 and to avoid incorrect electrical connection.

In operation, when the electrode 340 receives the relatively high voltage (such as the voltage VDD in the embodiment shown in FIG. 1) and the electrode 350 receives the relatively low voltage (such as the voltage VSS in the embodiment shown in FIG. 1), a current I31 is generated in the sub-chip 310 and flows from the p-type first diffusion layer 312 to the active layer 314 and then to the second diffusion layer 316. Then, a current I32 flows from the second diffusion layer 316 of the sub-chip 310 to the first diffusion layer 322 of the sub-chip 320 through the connecting element CON. Finally, a current I33 is generated in the sub-chip 320 and flows from the p-type first diffusion layer 322 to the active layer 324 and then to the second diffusion layer 326. As the currents I31 and I33 correspondingly pass through the active layer 314 of the sub-chip 310 and the active layer 324 of the sub-chip 320, the sub-chip 310 and the sub-chip 320 will emit light. Therefore, the series-connected LEDs DR1 and DR2 in FIG. 1 can adopt a structure like the semiconductor device 300, while the sub-chip 310 and the sub-chip 320 correspond to the LEDs DR1 and DR2 and are connected in series through the connecting element CON.

It is worth noted that the doped buffer layer 330 that includes p-type dopant(s) can avoid a leakage current that might be generated in the semiconductor device 300 and flow from the second diffusion layer 316 of the sub-chip 310 to the electrode 350 through the buffer layer 330, or a leakage current that might be generated between the second buffer layer 326 of the sub-chip 320 and the buffer layer 330. As discussed above, the second diffusion layers 316 and 326 are n-type epitaxy layers, and the buffer layer 330 is a p-type epitaxy layer, so PN junctions will form at the interfaces between the second diffusion layer 316 and the buffer layer 330 and between the second diffusion layer 326 and the buffer layer 330. Because the PN junction is open-circuited when being reverse-biased, the interfaces between the second diffusion layer 316 and the buffer layer 330 and between the second diffusion layer 326 and the buffer layer 330 can be seen as diodes. Specifically, because the sub-chip 310 receives the relatively high voltage through the electrode 340 and the buffer layer 330 receives the relatively low voltage through the electrode 350, the n-type second diffusion layer 316 has a voltage higher than the voltage of the p-type buffer layer 330, and the PN junction is reverse-biased. The regions in the second diffusion layer 316 and the buffer layer 330 that are close to the interface between the second diffusion layer 316 and the buffer layer 330 become depletion region, and only few carriers flow in such regions, so the interface between the second diffusion layer 316 and the buffer layer 330 is open-circuited and no current can flow from the second diffusion layer 316 to the buffer layer 330. In addition, because the second diffusion layer 326 and the buffer layer 330 receive the same voltage through the electrode 350, no current will be generated and flow through the PN junction formed at the interface between the second diffusion layer 326 and the buffer layer 330. In alternative embodiments, the buffer layer is undoped or very lightly doped, a leakage current might be generated in the buffer layer, and the power efficiency of the sub-chips might be affected.

In the embodiment shown in FIG. 3, the electrode 350 is extensively arranged on the first diffusion layer 322 of the second sub-chip 320 and has a height that is substantially the same as the height of the electrode 340 arranged on the first diffusion layer 312 of the first sub-chip 310. Such embodiment is advantageous for mass transfer of the semiconductor devices 300. In some embodiments, the spacing between the sub-chips 310 and 320 is larger than or equal to about 1 μm, and the length of each of the sub-chips 310 and 320 is smaller than or equal to about 100 μm.

In some embodiments, more than two sub-chips are formed in the same semiconductor device, and multiple connecting elements can be used to couple the sub-chips in series. For example, in the semiconductor device 300 shown in FIG. 3, another sub-chip (not shown in FIG. 3) having the first and second diffusion layers and active layer like the sub-chips 310 and 320 can be formed on the right side of the sub-chip 320. The first diffusion layer of such sub-chip can be coupled to the second diffusion layer 326 of the sub-chip 320 through another connecting element (not shown in FIG. 3). The electrode 350 can be rearranged to the rightmost part of the semiconductor device 300.

Figure 4:
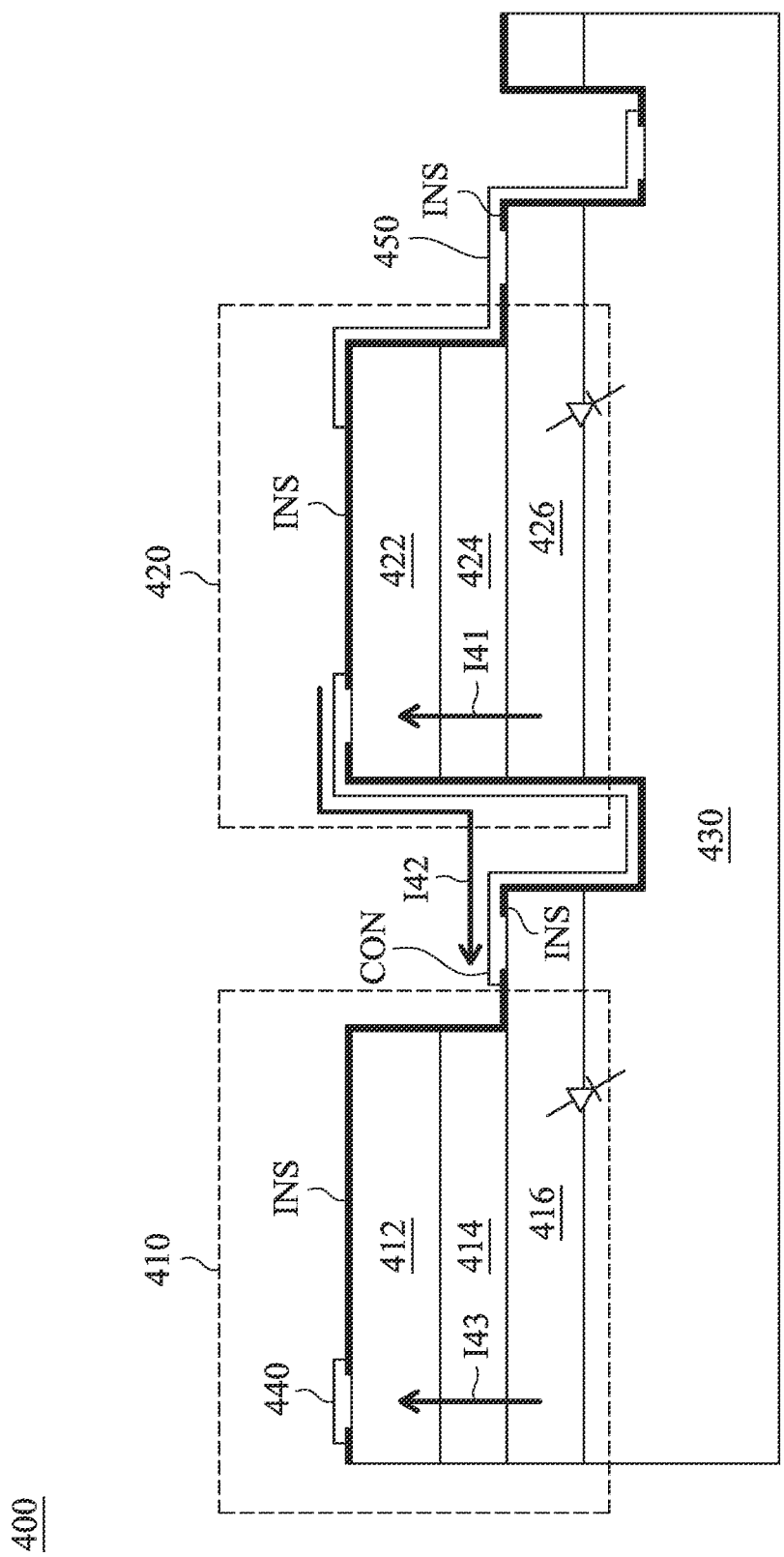
FIG. 4 is a cross-section diagram of a semiconductor device in accordance with some embodiments of the present disclosure.

Please refer to FIG. 4. FIG. 4 is a cross-section diagram of a semiconductor device 400 in accordance with some embodiments of the present disclosure. The semiconductor 400 has a structure that is close to the semiconductor device 300, but it has different dopants, and its electrodes receive different voltages as well. As shown in FIG. 4, the semiconductor device 400 includes a buffer layer 430 and two sub-chips 410 and 420 that are formed on the buffer layer 430. The sub-chip 410 includes a first diffusion layer 412, an active layer 414, and a second diffusion layer 416, and the sub-chip 410 includes a first diffusion layer 422, an active layer 424, and a second diffusion layer 426. The connecting element CON is configured to couple the second diffusion layer 416 of the sub-chip 410 with the first diffusion layer 422 of the sub-chip 420.

Unlike the semiconductor device 300 shown in FIG. 3, the first diffusion layer 412 of the sub-chip 410, the first diffusion layer 422 of the sub-chip 420, and the buffer layer 430 are n-type epitaxy layers that include n-type dopant(s), and the second diffusion layer 416 of the sub-chip 410 and the second diffusion layer 426 of the sub-chip 420 are p-type epitaxy layers that include p-type dopant(s).

In addition, the electrode 440 is configured to receive relatively low voltage (such as the voltage VSS in FIG. 1), and the electrode 450 is configured to receive relatively high voltage (such as the voltage VDD in FIG. 1). In operation, because the second diffusion layer 426 of the sub-chip 420 receives the relatively high voltage through the electrode 450, a current I41 is formed and flows from the second diffusion layer 426 to the active layer 424 and then to the first diffusion layer 422. Then, a current I42 flows from the first diffusion layer 422 of the sub-chip 420 to the second diffusion layer 416 of the sub-chip 410 through the connecting element CON. Finally, a current I43 flows from the second diffusion layer 416 to the active layer 414 and then to the first diffusion layer 412. The sub-chips 420 and 410 thereby emit light.

The doped buffer layer 430 that includes n-type dopant(s) can avoid a leakage current that is generated in the semiconductor device 400. PN junctions will form at the interfaces between the p-type second diffusion layer 416 and the n-type buffer layer 430 and between the p-type second diffusion layer 426 and the n-type buffer layer 430. Therefore, when the buffer layer 430 has a voltage relatively higher than the second diffusion layer 416 or the second diffusion layer 426, the PN junction is reverse-biased and open-circuited. In other words, because the buffer layer 430 receives a relatively high voltage through the electrode 450 and the sub-chip 410 receives a relatively low voltage through the electrode 440, the PN junction at the interface between the second diffusion layer 416 and the buffer layer 430 is reverse-biased. Therefore, no current will flow from the buffer layer 430 to the second diffusion layer 416. In addition, because the buffer layer 430 and the second diffusion layer 426 receive the same voltage through the electrode 450, no leakage current will be generated and flow between them.

In some embodiments, more than two sub-chips can be formed in the same semiconductor device, and multiple connecting elements can be used to couple such sub-chips in series. For example, in the semiconductor device 400 shown in FIG. 4, another sub-chip (not shown in FIG. 4) having the first and second diffusion layers and active layer like the sub-chips 410 and 420 can be formed on the left side of the sub-chip 410. The second diffusion layer of such sub-chip can be coupled to the first diffusion layer 412 of the sub-chip 410 through another connecting element (not shown in FIG. 4). The electrode 440 can be rearranged to the leftmost part of the semiconductor device 400.

In conclusion, the series-coupled LEDs of the display circuit 100 shown in FIG. 1 can be implemented through the embodiments shown in FIGS. 3 and 4, and such embodiments can avoid leakage current and ensure light emitting efficiency of LED sub-chips.

Please refer back to FIG. 1. Because the LEDs DR1 and DR2 in the pixel 110 are coupled in series, compared with the LED DG or the LED DB in the pixel 110, they require larger driving voltage in order to emit light. In other words, it can cause additional power consumption if the same voltage VDD is provided to the three sub-pixel groups. For example, assuming that the LEDs DR1 and DR2 are red LEDs and have forward voltage of 2.5 V and that the LEDs DG and DB are green LED and blue LED and have forward voltage of 3 V, if the voltages that the driving circuits 120R, 120G, and 120B require are ignored, the voltage VDD of 5V can drive the three sub-pixel groups to emit lights, but the LEDs DG and DB actually require only voltages of 3V to emit light. Thus, excessive power is consumed. Accordingly, the present disclosure also provides a display circuit including more than three sets of voltages in order to further improve power efficiency of display circuit.

Figure 5B:
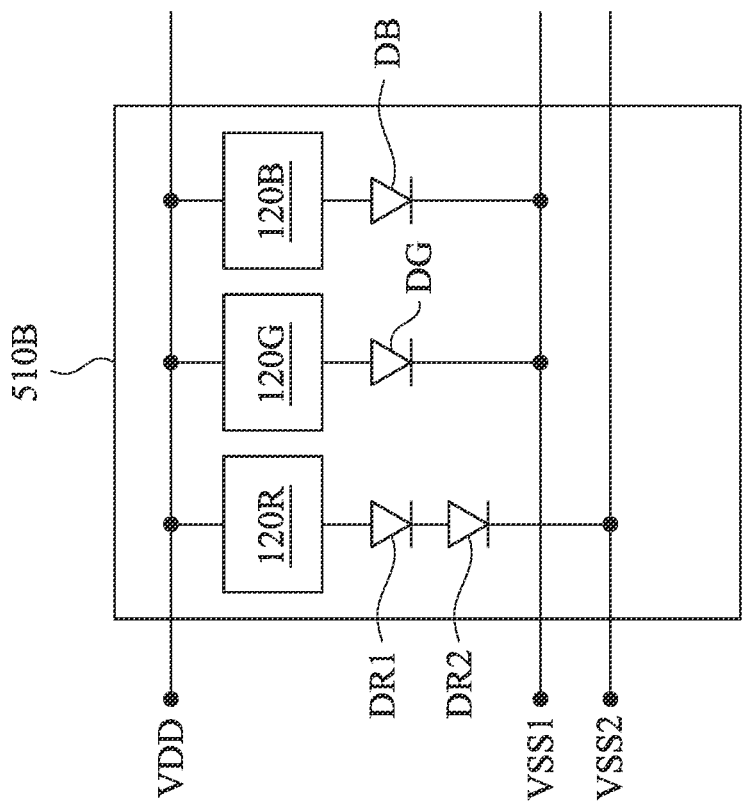
FIG. 5B is a diagram of a pixel in accordance with some embodiments of the present disclosure.
Figure 5A:
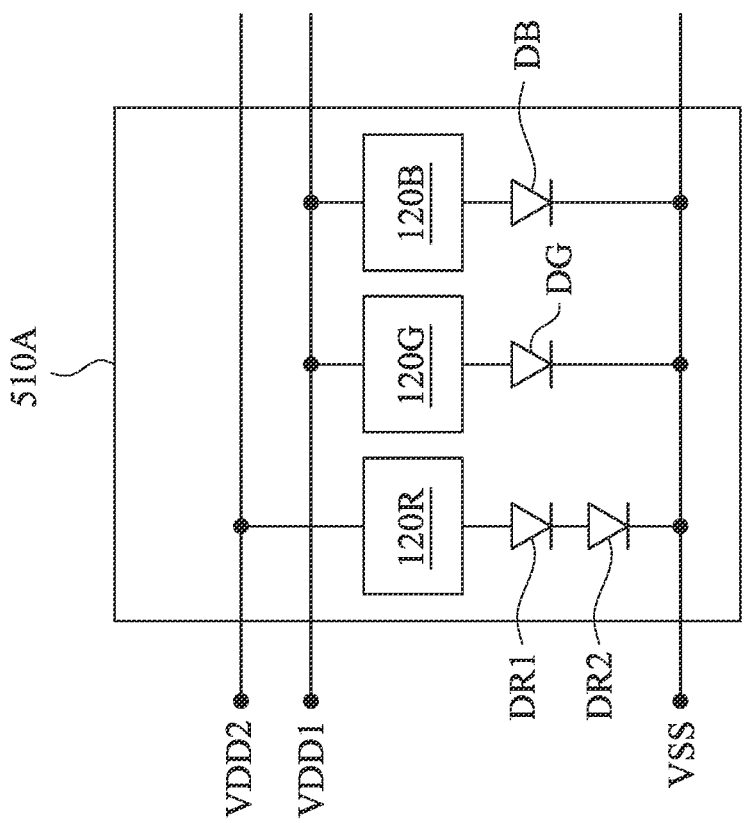
FIG. 5A is a diagram of a pixel in accordance with some embodiments of the present disclosure.

Please refer to FIG. 5A. FIG. 5A is a diagram of a pixel 510A in accordance with some embodiments of the present disclosure. The pixel 110 can change to adopt the design of the pixel 510A. As shown in FIG. 5A, the pixel 510A includes driving circuits 120R, 120G, and 120B and three sub-pixel groups (i.e., the first sub-pixel group formed by the LEDs DR1 and DR2, the second sub-pixel group formed by the LED DG, and the third sub-pixel group formed by the LED DB). Unlike the embodiment shown in FIG. 1, the first end of the driving circuit 120R receives a voltage VDD2, the first ends of the driving circuits 120G and 120B receive a voltage VDD1, and the voltages VDD2 and VDD1 are different.

In some embodiments, the LEDs DR1 and DR2 are red LEDs and have forward voltage of 2.5 V, the LEDs DG and DB are green LED and blue LED and have forward voltage of 3 V, and the voltage VDD1 can be smaller than the voltage VDD2 (e.g., the voltage VDD2 is 5V, the voltage VSS is 0 V, and the voltage VDD1 is 3 V). Thus, all LEDs can emit light and power consumption can be reduced.

In some embodiments, the voltage VDD2 is provided by a first reference voltage terminal of the display circuit, the voltage VSS is provided by a second reference voltage terminal of the display circuit, the voltage VDD1 is provided by a third reference voltage terminal of the display circuit, and the voltages VDD2, VSS, and VDD1 are different. In the embodiment shown in FIG. 5A, the voltages VDD2 and VDD1 are greater than the voltage VSS, and the voltage VDD2 is greater than the voltage VDD1. In addition, the series-coupled LEDs DR1 and DR2 are coupled between the first reference voltage terminal and the second reference voltage terminal, and the LED DG is coupled between the third reference voltage terminal and the second reference voltage terminal.

In some embodiments, the first sub-pixel group can include more LEDs in addition to the LEDs DR1 and DR2. In alternative embodiments, the first sub-pixel group of the pixel 510A includes only one red LED, while the second or third sub-pixel group includes multiple green LEDs or blue LEDs coupled in series.

Please refer to FIG. 5B. FIG. 5B is a diagram of a pixel 510B in accordance with some embodiments of the present disclosure. The pixel 110 can change to adopt the design of the pixel 510B. The pixel 510B has a structure that is close to the pixel 110 in FIG. 1; however, unlike the embodiment shown in FIG. 1, the second end of the LED DR2 receives a voltage VSS2, the second ends of the LEDs DG and DB receive a voltage VSS1, and the voltages VSS and VSS1 are different.

In some embodiments, the LEDs DR1 and DR2 are red LEDs and have forward voltage of 2.5 V, the LEDs DG and DB are green LED and blue LED and have forward voltage of 3 V, and the voltage VDD is 5V, the voltage VSS2 is 0 V, and the voltage VSS1 is 2 V.

In some embodiments, the voltage VDD is provided by a first reference voltage terminal of the display circuit, the voltage VSS2 is provided by a second reference voltage terminal of the display circuit, the voltage VSS1 is provided by a third reference voltage terminal of the display circuit, and the voltages VDD, VSS2, and VSS1 are different. In the embodiment shown in FIG. 5B, the voltages VSS2 and VSS1 are smaller than the voltage VDD, and the voltage VSS2 is smaller than the voltage VSS1. In addition, the series-coupled LEDs DR1 and DR2 are coupled between the first reference voltage terminal and the second reference voltage terminal, and the LED DG is coupled between the first reference voltage terminal and the third reference voltage terminal.

In some embodiments, when the pixel 510A in FIG. 5A or the pixel 510B in FIG. 5B operates in a light-emitting period, the current density of the LEDs is larger than 500 mA/cm$^2$ to ensure that the LEDs operate with high light-emitting efficiency.

Figure 6A:
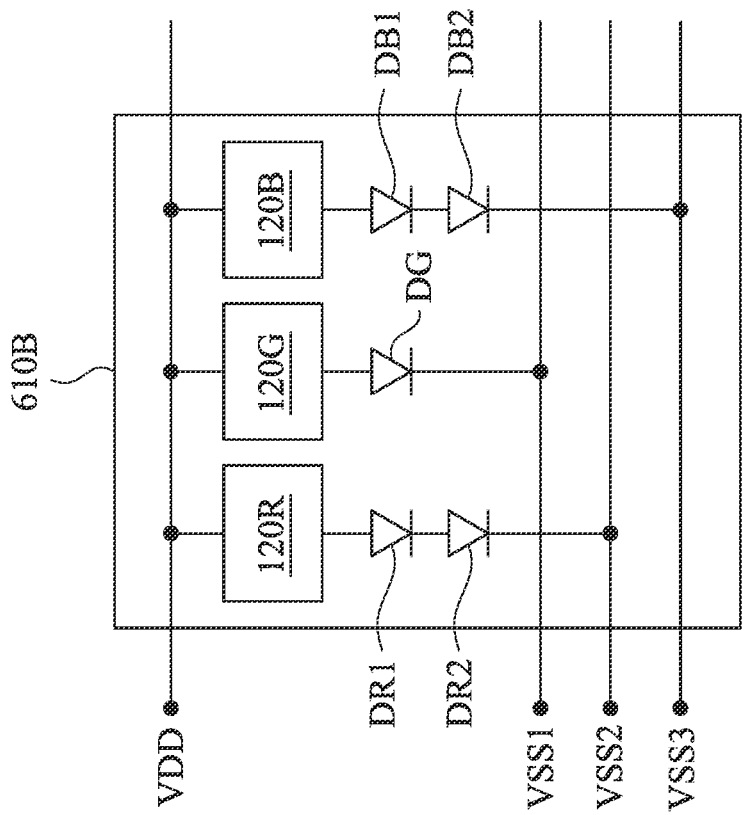
FIG. 6A is a diagram of a pixel in accordance with some embodiments of the present disclosure.

In some embodiments, multiple sub-pixel groups in each pixel can have LEDs coupled in series in order to better reduce power consumption of the display circuit. Please refer to FIG. 6A. FIG. 6A is a diagram of a pixel 610A in accordance with some embodiments of the present disclosure. The pixel 610A, like the pixel 510A in FIG. 5A, includes driving circuits 120R, 120G, and 120B to drive different sub-pixel groups. Unlike the pixel 510A in FIG. 5A, the third sub-pixel group of the pixel 610A includes LEDs DB1 and DB2 that are coupled in series, and the first end of the driving circuit 120B receives a voltage VDD3.

In some embodiments, the LEDs DR1 and DR2 are red LEDs and have forward voltage of 2.5 V, the LEDs DG and DB are green LED and blue LED and have forward voltage of 3 V, and the voltage VDD2 is 5V, the voltage VDD1 is 3 V, the voltage VDD3 is 6 V, and the voltage VSS is 0 V. In other words, different voltages are provided to different sub-pixel groups in order to avoid excessive power consumption.

In some embodiments, the voltage VDD2 is provided by a first reference voltage terminal of the display circuit, the voltage VSS is provided by a second reference voltage terminal of the display circuit, the voltage VDD1 is provided by a third reference voltage terminal of the display circuit, the voltage VDD3 is provided by a fourth reference voltage terminal of the display circuit, and the voltages VDD2, VSS, VDD1, and VDD3 are different than each other.

Figure 6B:
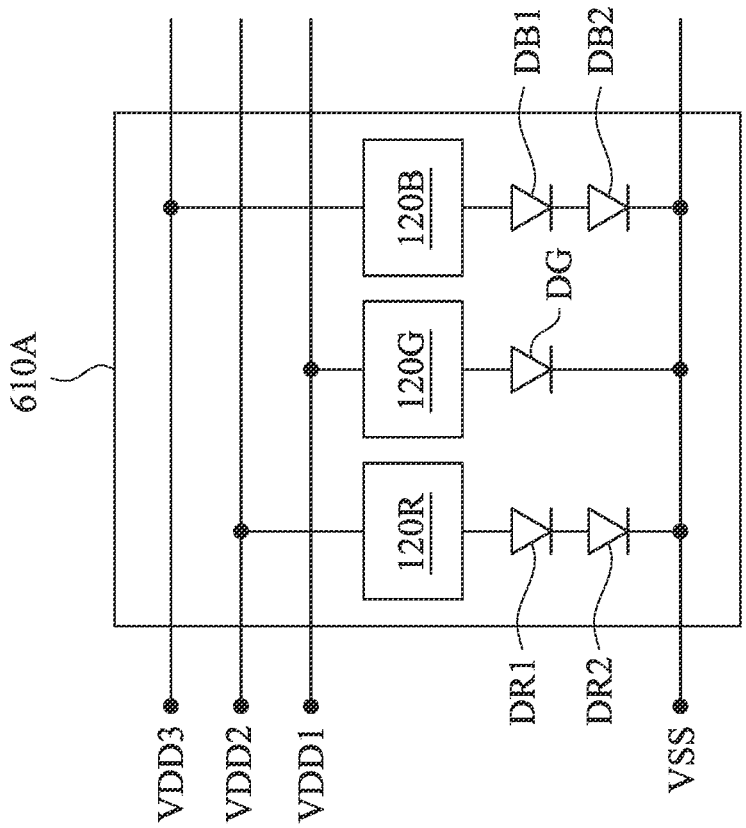
FIG. 6B is a diagram of a pixel in accordance with some embodiments of the present disclosure.

Please refer to FIG. 6B. FIG. 6B is a diagram of a pixel 610B in accordance with some embodiments of the present disclosure. The pixel 610B, like the pixel 510B in FIG. 5B, includes driving circuits 120R, 120G, and 120B to drive different sub-pixel groups. Unlike the pixel 510B in FIG. 5B, the third sub-pixel group of the pixel 610B includes LEDs DB1 and DB2 that are coupled in series, and the first end of the driving circuit 120B receives a voltage VSS3.

In some embodiments, the LEDs DR1 and DR2 are red LEDs and have forward voltage of 2.5 V, the LEDs DG and DB are green LED and blue LED and have forward voltage of 3 V, and the voltage VDD is 6 V, the voltage VSS2 is 1 V, the voltage VSS1 is 3 V, and the voltage VSS3 is 0 V.

In some embodiments, the voltage VDD is provided by a first reference voltage terminal of the display circuit, the voltage VSS2 is provided by a second reference voltage terminal of the display circuit, the voltage VSS1 is provided by a third reference voltage terminal of the display circuit, the voltage VSS3 is provided by a fourth reference voltage terminal of the display circuit, and the voltages VDD, VSS2, VSS1, and VSS3 are different than each other.

In some embodiments, the sub-pixel group(s) in FIGS. 5A, 5B, 6A, and 6B that includes series-coupled LEDs has the structure of the embodiment shown in FIG. 3 or FIG. 4, so that multiple sub-chips are coupled in series through the connecting element and formed on the same structure, and the specific doping in different layers can avoid leakage current to ensure power efficiency.

In conclusion, the embodiments shown in FIGS. 5A, 5B, 6A, and 6B provide multiple sets of voltage to different sub-pixels in order to further reduce power consumption of display circuit, such as the one shown in FIG. 1.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display device, comprising:
   a plurality of pixels, each of the plurality of pixels comprising a plurality of sub-pixel groups, a first sub-pixel group of the plurality of sub-pixel groups comprising:
      at least two first light-emitting components coupled in series with each other; and
      a first driving circuit;
   a second sub-pixel group of the plurality of sub-pixel groups comprising:
      a second light-emitting component; and
      a second driving circuit;
   a third sub-pixel group of the plurality of sub-pixel groups comprises:
      at least two third light-emitting components coupled in series with each other; and
      a third driving circuit;
   a first reference voltage terminal coupled with the first driving circuit, configured to provide a first reference voltage to the plurality of pixels;
   a second reference voltage terminal, configured to provide a second reference voltage to the plurality of pixels;
   a third reference voltage terminal coupled with the second driving circuit, configured to provide a third reference voltage to the plurality of pixels; and
   a fourth reference voltage terminal coupled with the third driving circuit, configured to provide a fourth reference voltage to the plurality of pixels;
   wherein the first reference voltage, the second reference voltage, the third reference voltage and the fourth reference voltage are all distinct and different from each other,
   wherein the at least two first light-emitting components coupled in series with each other in the first sub-pixel group are coupled in series with the first driving circuit to receive the first reference voltage and coupled to the second reference voltage terminal to receive the second reference voltage, and the second light-emitting component in the second sub-pixel group is coupled to the third reference voltage terminal to receive the third reference voltage,
   wherein the first reference voltage is configured as a first power supply voltage to drive the at least two first light-emitting components in the first sub-pixel group, and a voltage level of the first power supply voltage provides forward voltages of the at least two first light-emitting components, wherein the third reference voltage is configured as a second power supply voltage to drive the second light-emitting component in the second sub-pixel group, and a voltage level of the second power supply voltage provides a forward voltage of the second light-emitting component, wherein the third sub-pixel group in the third sub-pixel group is coupled to the fourth reference voltage terminal to receive the fourth reference voltage, wherein the fourth reference voltage is configured as a third power supply voltage to drive the at least two third light-emitting components in the third sub-pixel group, and a voltage level of the third power supply voltage provides forward voltages of the at least two third light-emitting components.

2. The display device of claim 1, wherein the first reference voltage and the third reference voltage are both larger than the second reference voltage.

3. The display device of claim 1, wherein the second reference voltage and the third reference voltage are both smaller than the first reference voltage.

4. The display device of claim 1, wherein a current density of the first light-emitting components is larger than 500 mA/cm$^2$ in response to the first light-emitting components operating in a light-emitting period.

5. The display device of claim 1, wherein the second sub-pixel group and a third sub-pixel group of the plurality of sub-pixel groups are both coupled between the third reference voltage terminal and the second reference voltage terminal.

6. The display device of claim 1, wherein the second sub-pixel group and a third sub-pixel group of the plurality of sub-pixel groups are both coupled between the first reference voltage terminal and the third reference voltage terminal.

7. The display device of claim 1,
wherein the at least two first light-emitting components is configured to emit red light,
wherein the second light-emitting component is configured to emit green light,
wherein
the at least two third light-emitting components is configured to emit blue light.

8. The display device of claim 7, wherein
the second sub-pixel group of the plurality of sub-pixel groups is coupled between the third reference voltage terminal and the second reference voltage terminal, and the third sub-pixel group of the plurality of sub-pixel groups is coupled between the fourth reference voltage terminal and the second reference voltage terminal.

9. The display device of claim 7, wherein
the second sub-pixel group of the plurality of sub-pixel groups is coupled between the first reference voltage terminal and the third reference voltage terminal, and the third sub-pixel group of the plurality of sub-pixel groups is coupled between the first reference voltage terminal and the fourth reference voltage terminal.

10. The display device of claim 1, wherein
the first light-emitting components coupled in series comprise:
a buffer layer;
a first sub-chip and a second sub-chip, separately arranged on the buffer layer, each of the first sub-chip and the second sub-chip comprising:
a first diffusion layer;
an active layer; and
a second diffusion layer;
wherein the first diffusion layer, the active layer, and the second diffusion layer are arranged on the buffer layer in a top-down order, the first diffusion layer and the buffer layer are first-type epitaxy layers, and the second diffusion layer is a second-type epitaxy layer; and
a connecting element, configured to electrically couple the second diffusion layer of the first sub-chip with the first diffusion layer of the second sub-chip.

\* \* \* \* \*